(12) United States Patent
Pahl

(10) Patent No.: US 9,481,565 B2
(45) Date of Patent: Nov. 1, 2016

(54) ENCAPSULATED COMPONENT COMPRISING A MEMS COMPONENT AND METHOD FOR THE PRODUCTION THEREOF

(71) Applicant: Epcos AG, München (DE)

(72) Inventor: Wolfgang Pahl, München (DE)

(73) Assignee: Epcos AG, München (DE)

( * ) Notice: Subject to any disclaimer, the term of this patent is extended or adjusted under 35 U.S.C. 154(b) by 0 days.

(21) Appl. No.: 14/759,602

(22) PCT Filed: Oct. 23, 2013

(86) PCT No.: PCT/EP2013/072183
§ 371 (c)(1),
(2) Date: Jul. 7, 2015

(87) PCT Pub. No.: WO2014/111178
PCT Pub. Date: Jul. 24, 2014

(65) Prior Publication Data
US 2015/0344296 A1    Dec. 3, 2015

(30) Foreign Application Priority Data

Jan. 15, 2013    (DE) .......................... 10 2013 100 388

(51) Int. Cl.
*B81B 7/00* (2006.01)
*B81C 1/00* (2006.01)
(Continued)

(52) U.S. Cl.
CPC ........... *B81B 7/0058* (2013.01); *B81B 7/0054* (2013.01); *B81B 7/0061* (2013.01); *B81C 1/0023* (2013.01); *B81C 1/00301* (2013.01); *H04R 23/00* (2013.01); *B81B 7/007* (2013.01); *B81B 2201/0257* (2013.01); *B81B 2201/0264* (2013.01); *B81B 2207/012* (2013.01);
(Continued)

(58) Field of Classification Search
CPC .. B81B 7/0058; H04R 23/00; B81C 1/00301
See application file for complete search history.

(56) References Cited

U.S. PATENT DOCUMENTS 7,436,054 B2 * 10/2008 Zhe ...................... B81C 1/0023
257/686
8,077,900 B2    12/2011 Minamio et al.
(Continued)

FOREIGN PATENT DOCUMENTS

CN    101325823 A    12/2008
DE    10152343 A1    5/2003
(Continued)

OTHER PUBLICATIONS

International Preliminary Report on Patentability for PCT Application No. PCT/EP2013/072183 dated Jul. 30, 2015 (10 pages).
(Continued)

*Primary Examiner* — William Coleman
(74) *Attorney, Agent, or Firm* — Nixon Peabody LLP

(57) ABSTRACT

A component comprising a carrier, a chip component and a MEMS component is proposed, wherein the mechanically sensitive MEMS component is mounted below a half-shell on the carrier. The component is encapsulated with a molding compound in a transfer molding process.

18 Claims, 3 Drawing Sheets

(51) Int. Cl.
*H04R 23/00* (2006.01)
*B81C 3/00* (2006.01)

(52) U.S. Cl.
CPC .......... *B81C3/001* (2013.01); *B81C 2201/034* (2013.01); *B81C 2203/0154* (2013.01); *H01L 2224/32145* (2013.01); *H01L 2224/48091* (2013.01); *H01L 2224/48227* (2013.01); *H01L 2224/48247* (2013.01); *H01L 2224/48471* (2013.01); *H01L 2224/48472* (2013.01); *H01L 2924/1461* (2013.01); *H01L 2924/19107* (2013.01); *H04R 2201/003* (2013.01)

(56) References Cited

U.S. PATENT DOCUMENTS

| | | | | |
|---|---|---|---|---|
| 8,169,041 B2* | 5/2012 | Pahl | ...................... | B81B 7/0064 257/416 |
| 8,359,927 B2* | 1/2013 | Hooper | ................ | B81B 7/0061 73/715 |
| 9,040,335 B2* | 5/2015 | Boon Yew | ............ | B81B 7/0038 257/420 |
| 9,061,888 B2* | 6/2015 | Pahl | ...................... | B81B 7/0048 |
| 9,162,872 B2* | 10/2015 | Goida | .................. | B81B 7/0032 |
| 2005/0253207 A1 | 11/2005 | Garcia | | |
| 2008/0083957 A1 | 4/2008 | Wei et al. | | |
| 2009/0127697 A1 | 5/2009 | Pahl | | |
| 2013/0075888 A1 | 3/2013 | Chang et al. | | |

FOREIGN PATENT DOCUMENTS

| | | |
|---|---|---|
| DE | 102008039706 A1 | 3/2009 |
| DE | 102008057297 A1 | 5/2009 |
| DE | 102011102266 A1 | 11/2012 |
| FR | 2907632 A1 | 4/2008 |
| JP | 2009-226571 A | 10/2009 |
| JP | 2010021225 A | 1/2010 |
| JP | 2012-195417 A | 10/2010 |

OTHER PUBLICATIONS

International Search Report corresponding to co-pending International Patent Application Serial No. PCT/EP2013/072183, European Patent Office, dated May 28, 2014; (4 pages).

* cited by examiner

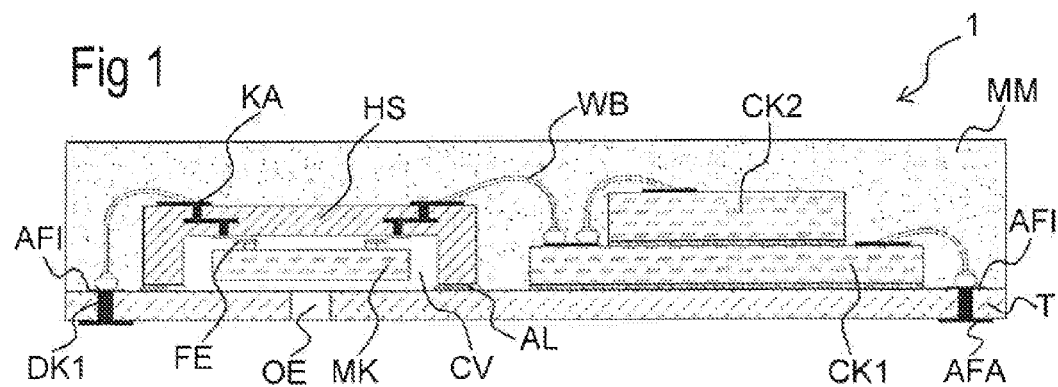
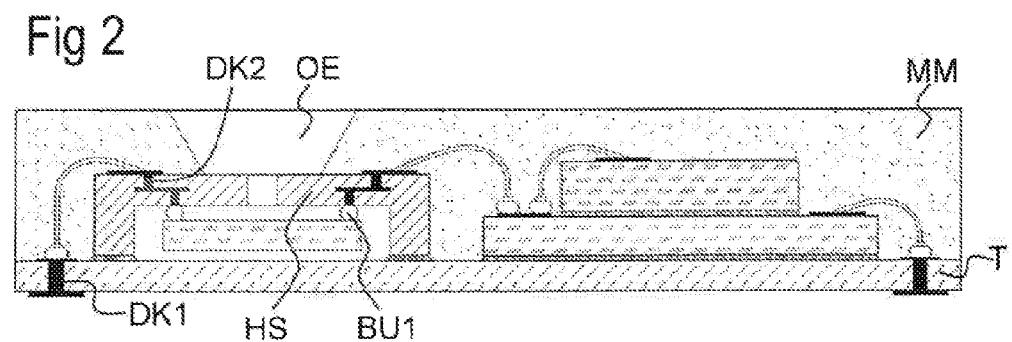
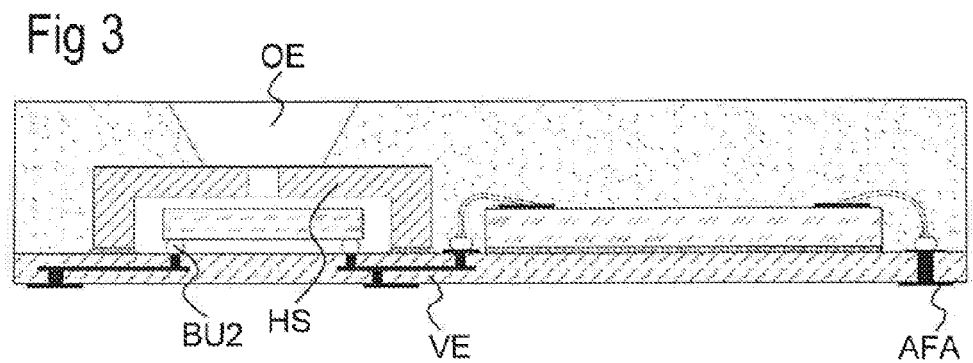
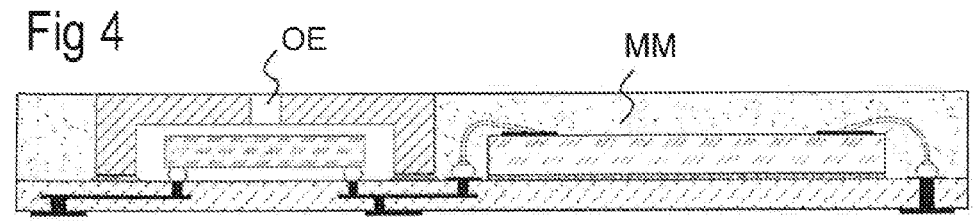

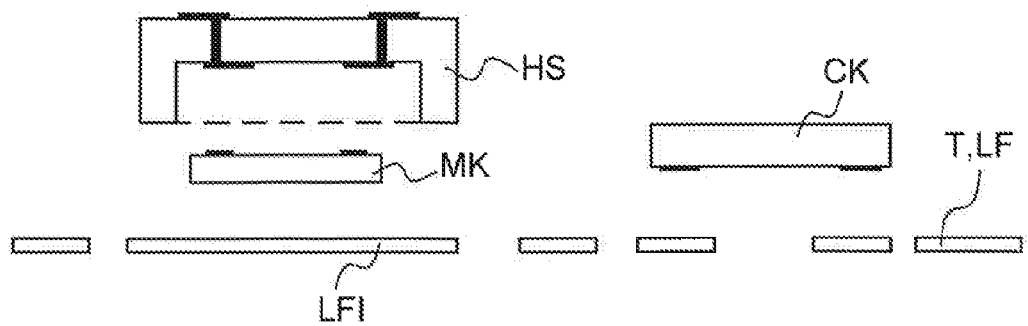
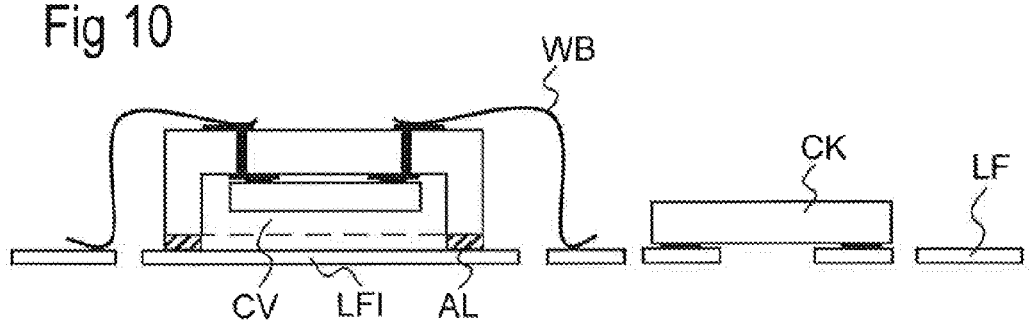
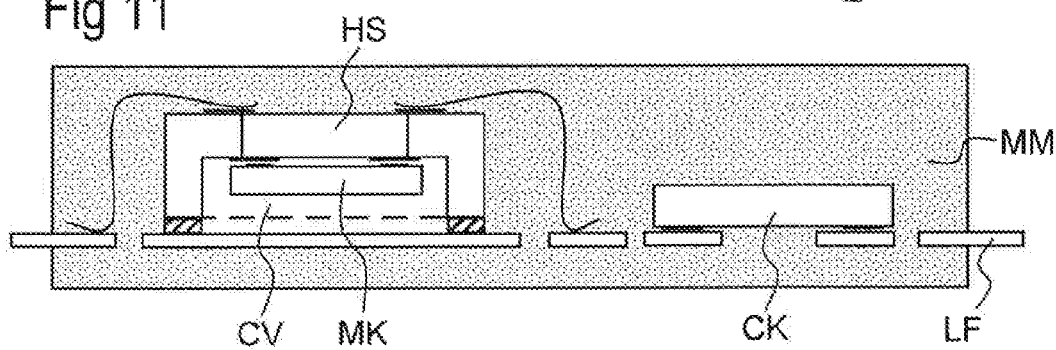

ENCAPSULATED COMPONENT COMPRISING A MEMS COMPONENT AND METHOD FOR THE PRODUCTION THEREOF

CROSS-REFERENCE TO RELATED APPLICATIONS

This application is a U.S. National Stage of International Application No. PCT/EP2013/072183, filed on Oct. 23, 2013, which claims the benefit of Germany Patent Application No. 10 2013 100 388.5, filed on Jan. 15, 2013, both of which are incorporated herein by reference in their entireties.

Mechanically insensitive semiconductor components are generally packaged efficiently by molding, wherein, in a molding method, e.g. a transfer molding method, a corresponding plastic compound is forced around the chip and cured. In this case, however, mechanically sensitive chips having filigree or movable structures, such as MEMS components, for example, would be disturbed in terms of their function or even irreversibly damaged.

Therefore, components which contain mechanically sensitive components such as MEMS components, for example, can be encapsulated by means of a transfer molding method only if the MEMS component is protected against mechanical damage before it is encapsulated by molding at normally high pressure.

It is an object of the invention to specify a component comprising a MEMS component which has simple protection against environmental influences and is simple and cost-effective to produce.

This object is achieved according to the invention by means of a component according to claim 1. Advantageous configurations and a method for producing the component can be gathered from further claims.

For a component comprising a MEMS component and a mechanically less sensitive chip component, it is proposed to arrange the two or more components on a carrier and to encapsulate the entire component with a molding compound, such that at least the top side of the carrier and the side surface of the chip component and of the MEMS component are covered by the molding compound. While the chip component is mounted on the carrier directly and without protection, the MEMS component is arranged below a half-shell seated on the carrier such that between carrier and half-shell there arises a cavity which is closed toward the carrier and can accommodate the MEMS component. The carrier has internal and external electrical connection areas, wherein the MEMS component and the chip component are connected to the internal connection areas. The external connection areas are not covered by the molding compound, or are freely accessible.

The component comprising the MEMS component and the chip component or chip components can form a functional unit and constitute a module. It can therefore comprise components which interact and are oriented toward fulfilling a function.

As a result of the arrangement of the MEMS component below the half-shell, the carrier can be used as a housing cover for the half-shell, such that a complete packaging of the MEMS component is obviated. As a result of the arrangement of the MEMS component in the cavity formed by the sufficiently stable half-shell and the carrier, the component can be encapsulated by transfer molding in a reliable manner, without the risk of damage to the MEMS component.

In one embodiment, the carrier is constructed from an electrically insulating material in a multilayered fashion and has upwardly facing internal connection areas and downwardly facing external connection areas. At least one wiring plane is provided in the interior of the multilayered carrier, said at least one wiring plane being connected to the internal and external connection areas by means of first plated-through holes.

In one embodiment, the chip component and the MEMS component arranged below a half-shell are arranged on the surface (top side) of the carrier. In this embodiment the molding compound is applied on the carrier such that at least the top side of the carrier and the side surfaces of chip and MEMS components are covered by the molding compound.

The top sides—facing away from the carrier—of the chip components and of the half-shell above the MEMS component can likewise be covered by molding compound. However, it is also possible to cause at least one top side of chip component or half-shell to terminate flush with the molding compound. This is possible in particular for such components which have no mechanically sensitive structures at the top side or have structures sensitive to environmental influences such as corrosive attacks, for example.

In one embodiment, the half-shell constitutes a housing trough such as is used for SMD housings, for example. The housing trough has a housing base having internal and external contacts and then facing upward in the component. Hereinafter, the relative arrangement "at the top" is related to a carrier arranged "at the bottom" and faces away from the carrier in the direction of the components.

In this embodiment, the MEMS component is mounted on the carrier not directly, but rather into the interior of the housing trough and is electrically conductively connected to the internal contacts provided there. The external contacts of the housing trough, which are connected to the internal contacts via second plated-through holes through the housing base, are connected to the internal connection areas of the carrier by means of bonding wires. Therefore, the SMD contacts (=external contacts) of the housing trough are co-opted here as contact locations for the wire bonding. In order to protect the bonding wires, the molding compound is then applied with a corresponding thickness such that the housing trough and the bonding wires are completely enclosed and protected by the molding compound. The chip component, which usually has a smaller height than the housing trough, is likewise completely covered by the molding compound.

The housing trough is fixedly connected to the top side of the carrier, various connection techniques being suitable. The housing trough can be fixed on the carrier in a simple manner by means of an adhesive. If the adhesive layer is applied completely on the lower edge of the housing trough, the cavity between housing trough and carrier can in this case at the same time be sufficiently tightly closed by the adhesive joint, such that, firstly, the molding compound cannot penetrate into the cavity during the molding process and that, secondly, there is a sufficiently firm mechanical connection between housing trough and carrier.

In one embodiment, the MEMS component is connected to the housing base in the housing trough by means of elastic metallic spring elements. The elastic spring elements guarantee a low-stress fixing of the MEMS component, on which then at best the spring stress of the spring elements can still act. The spring elements can be embodied as leaf springs which bear on the housing base by one end and the other end of which is bent away in a stepped fashion, for example, such that it has a clear distance from the housing base. This end is also fixed to the MEMS component. The metallic spring elements ensure a sufficiently firm mechanical connection and at the same time produce the electrical contact with the internal contacts of the housing trough. The metallic spring elements can additionally be bent away in a plane parallel to the housing base, such that not only can they exert an elastic deflection in the vertical direction with respect to the housing base, but they are also elastically deflectable in the suspension plane.

In one embodiment, the component has an opening allowing media access to the MEMS components below the half-shell. In this case, the opening can pass through the carrier and thus provide access to the cavity from below. It is also possible to lead the opening from the top through the half-shell. If the molding compound covers the half-shell from the top, then the opening is also led through the molding compound.

An opening through the carrier can already be present before the process of mounting the components. An opening in the half-shell can likewise be produced before or after encapsulation and molding. In the embodiment in which the top side of the half-shell continues not to be covered by molding compound, the opening in the half-shell can also already be provided prior to mounting and is then protected against the molding process without any further measure.

Media access to the MEMS component is required if an interaction of the MEMS component with an ambient parameter is desired, such as is required for a sensor, for example. A MEMS component embodied as a microphone can also be addressed via said opening and allow sound admission. The same correspondingly applies to a MEMS component embodied as an air pressure sensor.

In one embodiment of the component, the half-shell consists of a material or has a design which is not mechanically able to withstand a transfer molding process. In this case, transfer molding can nevertheless be used for encapsulation if the molding compound is applied and injected around the component such that the upwardly facing main surface of the half-shell continues not to be covered by the molding compound. In this case, the upwardly facing main surface of the half-shell is preferably chosen to be planar and then terminates flush with the surface of the molding compound. This has the advantage that the pressure used during transfer molding does not act on the top side of the half-shell, which constitutes the largest surface area, but rather only on the side walls, which have a greater stability in relation to the molding method on account of their smaller surface area. In this embodiment, the material of the half-shell can then consist of a polymer or comprise a polymer.

In other embodiments, the half-shell consists of a mechanically more stable material selected from ceramic, semiconductor material, metal, glass or plastic, and a composite material comprising one of the aforementioned materials. The half-shell can be multilayered in order to combine different properties of the individual layers with one another, for example electrical insulator properties with mechanically stable material, electrically conductive properties with electrically insulating material or electromagnetically shielding properties together with electrically insulating properties.

The half-shell is fixed by means of an adhesive layer applied on the carrier such that a closed cavity is formed between the half-shell and the carrier.

In accordance with a further embodiment, the carrier is a lead frame having an island formed in a planar fashion. The area of the island is dimensioned at least with a magnitude such that it forms a closed cavity together with a half-shell adhesively bonded thereon, the MEMS component then being enclosed in said cavity. The encapsulation with molding compound encloses the entire lead frame in such a way that only the connection lugs of the lead frame which form the external connection areas remain free. The molding compound is then pressed both from above onto the component and from below onto the lead frame. In one embodiment, only the connection lines or connection pins of the lead frame then project from the molding compound.

A lead frame as carrier has the advantage that it can be produced cost-effectively and makes available directly without further measures the conductor tracks and soldering areas or the internal and external connection areas for making contact with chip component and MEMS component. A lead frame is advantageous even if the primary goal for optimization of the component is not orientated toward a minimum area requirement.

In a further embodiment, the MEMS component is mounted directly onto the internal connection areas of the carrier. This can be carried out in an SMD method or by means of bump connections or by means of adhesive bonding using electrically conductive adhesive.

In one embodiment, the MEMS component is embodied as a sensor or as a microphone. In this embodiment, the opening already mentioned is then formed in the half-shell or in the carrier.

In accordance with one embodiment, the chip component is a bare die, a packaged active or passive component or some other electrical component that is able to withstand a transfer molding process.

The invention is explained in greater detail below on the basis of exemplary embodiments and the associated figures. The method for producing the component is also described in parallel therewith. The figures have been drawn up schematically and are not true to scale, and so neither absolute nor relative dimensional indications can be gathered from the figures. Individual parts of the figures may be illustrated with enlarged or reduced size, in order to afford a better understanding.

FIG. 1 shows in schematic cross section an encapsulated component having an opening at the bottom.

FIG. 2 shows a component having an opening at the top,

FIG. 3 shows a component wherein the MEMS component is fixed on the carrier,

FIG. 4 shows a component wherein the molding compound terminates flush with the upper edge of the half-shell, FIGS. 9 to 11 show different method stages during the production of a component in accordance with a second exemplary embodiment.

Figure 5:
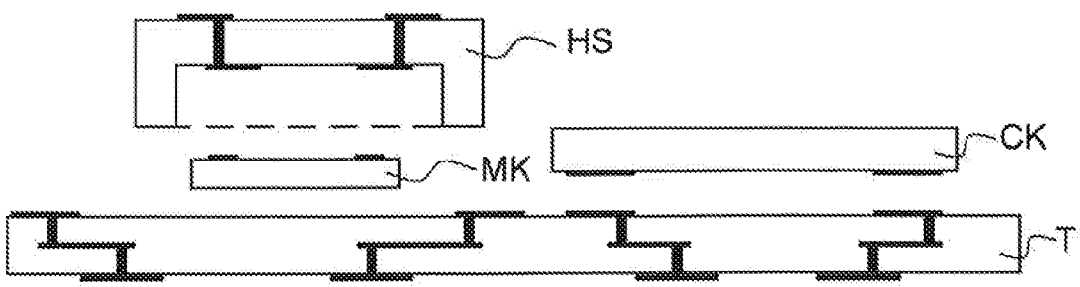
FIGS. 5 to 8 show different method stages during the production of a component in accordance with a first exemplary embodiment.

FIG. 1 shows a first embodiment, in which the MEMS component MK is fixed in a housing trough of a half-shell HS embodied as an SMD housing. The electrical and mechanical fixing of the MEMS component MK in the housing trough is effected by means of metallic spring elements. The latter are embodied for example as metallic strips which are bent in a stepped fashion and are preferably bent away in a direction parallel to the housing base. The metallic spring elements contact the internal contacts KI of the housing trough in a first plane of the step and the MEMS component MK in a second plane at a distance from the base of the housing trough. Said MEMS component can be connected to the spring elements by means of bumps.

The half-shell HS, or the housing trough, is adhesively bonded upside down on a carrier T, such that it encloses a cavity CV with the carrier T. By means of the elastic spring elements FE the MEMS component is elastically suspended within the cavity CV such that mechanically sensitive parts are not in direct contact with the carrier or with the housing trough.

Furthermore, at least one chip component CK, for example a semiconductor component, is mounted on the surface of the carrier. The semiconductor component can be an ASIC for controlling the MEMS component. In the embodiment illustrated, a second chip component CK2 having a smaller cross-sectional area is adhesively bonded on the top side of a first chip component CK1.

In FIG. 1, all of the electrical connections of the chip components and of the MEMS component are effected by means of bonding wires WB. The external contacts KA of the housing trough are connected for example to internal connection areas AFI of the carrier by means of a first bonding wire WB (illustrated on the left in the figure). A second bonding wire connects a further external contact KA of the housing trough HS to a contact of the first chip component CK1. A further bonding wire WB connects the first chip component CK1 to the second chip component CK2 fixed thereon. A further bonding wire connects the first chip component to a further internal connection area AFI of the carrier T. All of the components of the component 1 are interconnected with one another then by means of bonding wires. Therefore, it suffices to provide a monolayer carrier T wherein first plated-through holes DK1 connect the internal connection areas to the external connection areas AFA arranged on the opposite side.

Alternatively, it is also possible to provide the interconnection of the components by means of a wiring plane in the carrier T, which can then be embodied in a multilayered fashion.

In the embodiment shown, the MEMS component is a sensor for e.g. air pressure, air humidity and air composition or a microphone, and therefore requires an opening OE for media access, which opening here is led through the carrier T into the interior of the cavity CV.

The MEMS component can also be embodied as a different sensor, e.g. for magnetic fields, and then does not require an opening.

The component 1 can comprise further chip components CK or further MEMS components MK not shown here. The entire component is encapsulated from the top side with a molding compound MM, which here covers the surface of the carrier and is applied over all chip and MEMS components with a thickness such that all of the surfaces and the bonding wires are encapsulated. By means of a transfer molding method, the molding compound MM is provided with a spatial shape embodied in a cubic or parallelepipedal fashion. All of the external connection areas AFA are arranged on the underside of the component 1 and serve for electrically connecting the component to an external circuit environment.

The molding compound MM is preferably a thermosetting polymer that is preferably filled with an electrically insulating filler in order to increase the mechanical strength and in order to increase the electrical insulation.

FIG. 2 shows a further embodiment, wherein, in contrast to FIG. 1, the MEMS component MK is connected by means of a normal bump connection BU1 to the internal contacts KI of a half-shell HS embodied as a housing trough. Moreover, the opening OE for enabling media access is led into the cavity CV from above through molding compound and housing trough. The opening OE can be led through the molding compound in a first method step, a corresponding segment of the surface of the housing trough being exposed. In a second method step, the opening is then led through the base of the housing trough. Mechanical ablation methods or drilling methods and, with restrictions, also chemical and physical etching methods are appropriate for this purpose.

In the case of a so-called "tape-assisted mold" method, a surface of the component to be encapsulated by molding can be kept free. This can be used then to keep free the region of the surface of the component or of the MEMS component which is provided for the opening.

FIG. 3 shows a further embodiment, wherein the MEMS component MK is electrically and mechanically fixed directly on the carrier T by means of second bump connections BU2. The MEMS component is enclosed below a half-shell HS, which is adhesively bonded on the surface of the carrier. The half-shell can consist of a uniform mechanically stable material or is embodied as a multilayered composite. In this embodiment, an opening OE led from above through molding compound and half-shell HS is advantageous. However, an opening led through the carrier T from below is not ruled out.

In this embodiment, an electrical contacting of the MEMS component MK is possible only from below through the carrier. Therefore, the wiring is preferably effected within the carrier T by means of a wiring plane VE. The chip component CK can be contacted by means of a bonding wire WB as illustrated. However, it is also possible to solder the chip component CK as an SMD component onto the carrier T.

FIG. 4 shows an embodiment for which a half-shell HS composed of mechanically less stable material can be used. Chip components and MEMS component are arranged as in the embodiment according to FIG. 3. In order that the mechanically less stable half-shell HS is not loaded by the transfer molding process, the molding compound MM is injected only as far as the upper edge of the half-shell, such that the top side of the half-shell terminates flush with the surface of the molding compound MM. Here, too, the opening OE is led through the half-shell. Alternatively, the opening can also be led into the cavity through the carrier.

FIGS. 3 and 4 show embodiments which are optimized toward a small component height. In this embodiment, it may be advisable to embody the chip component with a small structural height or to avoid stacking of chip components, as is the case in the figures. However, sufficiently thin chip components can nevertheless be stacked one above another and be electrically connected to one another.

FIGS. 5 to 8 show various method stages during the production of the component in schematic cross section.

Figure 6:
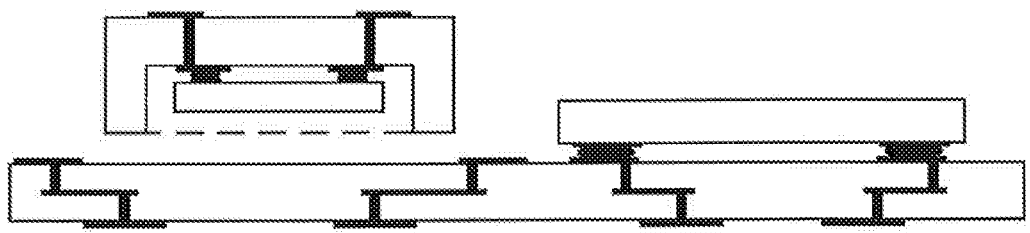
Figure 7:
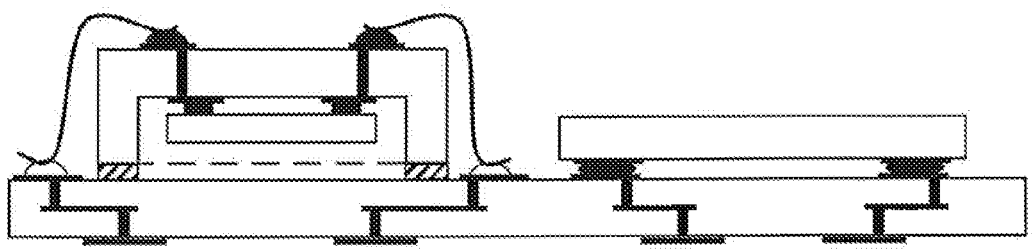

FIG. 5 shows the components of the component separately from one another, in particular a multilayered carrier T, a chip component CK, a MEMS component MK and a half-shell HS embodied as a housing trough. FIG. 6 shows a method stage wherein the MEMS component is bonded internally onto the base of the housing trough HS, for example by means of an electrically conductive adhesive or by means of solder or bump connections. The chip component can likewise be applied by bonding, or by adhesive bonding. A chip component CK fixed by means of SMD methods is illustrated. The half-shell is subsequently adhesively bonded on the surface of the carrier T, thus giving rise to a cavity between carrier and half-shell, in which the MEMS component MK is arranged and securely enclosed. The electrical connection of the MEMS component to the carrier T is effected by means of bonding wires which connect internal connection areas AFI to external contacts on the top side of the half-shell HS.

Figure 8:
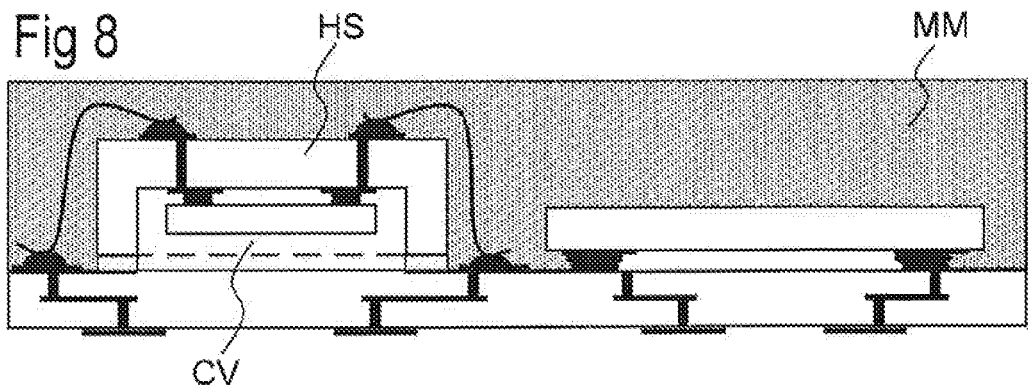

FIG. 8 shows the arrangement after a transfer molding process has been carried out, wherein a molding compound MM is pressed onto the surface of the component such that all components including the bonding wires are completely embedded in the molding compound. An opening OE can subsequently be produced, which, depending on the application, can be led from above through molding compound and half-shell HS or from below through the carrier into the cavity CV. Alternatively, the opening may have been prepared in the half-shell and is then kept free during molding.

FIGS. 9 to 11 show various method stages during the production of a component 1 in accordance with a second method variant. Here a lead frame LF is used as the carrier T, said lead frame consisting e.g. of a structured or stamped sheet-metal strip. The lead frame essentially has internal contacts connected to outwardly facing connection lugs. The internal connection areas serve for making contact with chip components CK and the MEMS component MK. Alternatively, the underside of the lead frame can terminate flush with the molding compound. A component which is processable by means of SMD methods can be obtained in this way.

FIG. 9 shows the components separately from one another. The MEMS component MK is once again inserted internally into a half-shell HS embodied as a housing trough of an SMD housing and is electrically and mechanically connected there to the internal contacts of the half-shell. The chip component CK can be bonded directly onto the carrier T, or the corresponding internal connection areas thereof, for example by adhesive bonding or soldering. The half-shell with the MEMS component fixed therein is adhesively bonded onto a connection plate of the lead frame, said connection plate being embodied in an island-shaped fashion, such that the housing trough is closed by the island-shaped connection area of the lead frame. The electrical contacting of the half-shell HS and thus of the MEMS component is effected by means of bonding wires WB which connect the external contacts KA to corresponding connection areas on the lead frame. FIG. 10 shows the arrangement at this method stage.

In the next step the entire component, that is to say the lead frame, the components fixed thereon including the bonding wires, is encapsulated with a molding compound in a transfer molding process, such that only the external connections of the carrier, which are embodied here as connection lugs of the lead frame, project from the molding compound. The connection lugs of the lead frame can subsequently also be bent downward in order to simplify a simpler mounting of the component 1 on a circuit board or some other external circuit environment.

The illustration does not show the provision of an opening, which once again can be drilled from above through the molding compound and the housing base of the housing trough. However, it is also possible to provide media access to the cavity below the housing trough from the bottom, by drilling from the bottom through the molding compound and the island-shaped section of the lead frame.

The invention is not restricted to the exemplary embodiments and the embodiments illustrated in the figures. Rather, features illustrated in individual figures can be combined with other features from other figures. In this regard, in practically every exemplary embodiment, the opening can be led either from above through the half-shell or from below through the carrier. In most exemplary embodiments, the MEMS component can be fixed in a housing trough independently of the exemplary embodiment in different ways which have each been described per se in different examples. The exact embodiment of the housing trough is likewise not restricted to the embodiments illustrated, as long as it comprises internal and external contacts which are connected to one another via second plated-through holes. It is also possible to provide wiring planes in the housing trough. The half-shell, which can be embodied as a housing trough, is preferably adhesively bonded on the carrier, but this does not rule out other corresponding impermeable forms of fixing. The contacting of the housing trough to the carrier is preferably effected by means of bonding wires. The fixing and electrical contacting of the chip component are likewise independent of the invention and can be effected by means of bonding, adhesive bonding or wire contacting. The molding compound can be an arbitrary compound which can be used in a transfer molding process or a similar process and which has for the component the desired properties with regard to hardness, permeability to moisture and chemicals, electrical insulation, thermal conductivity and ageing stability.

A further property to be optimized may be the coefficient of thermal expansion of the compound, which is preferably adapted to that of the components in order to avoid unnecessary stresses during the curing of the molding compound. The component can have an arbitrary number of chip components, which can be arranged alongside one another on the carrier or which, in the case of a correspondingly low design, are stacked one above another. In this case, an upwardly decreasing basic area is advantageous since it is then possible more easily to make contact with the chip components situated at the bottom in the stack.

LIST OF REFERENCE SIGNS

1 Component
T Carrier
AFI, AFA Internal and external electrical connection areas
CK Chip component
MK MEMS component
HS Half-shell
MM Molding compound
VE Wiring plane
DK1 First plated-through holes (through the carrier)
DK2 Second plated-through holes (through the half-shell)
KI, KA Internal and external contacts
WB Bonding wires
FE Metallic spring elements
OE Opening in carrier or half-shell
LF Lead frame
AL Adhesive layer
LFI Island
CV Cavity (below half-shell)
BU Bump connection

The invention claimed is:
1. A component
wherein a chip component and a MEMS component are arranged on a carrier having internal and external electrical connection areas and are electrically conductively connected to the internal connection areas,
wherein the MEMS component is arranged below a half-shell seated on the carrier,
wherein the half-shell is adhesively bonded on the carrier such that a cavity closed toward the carrier is formed between the half-shell and the carrier,
wherein the entire component is encapsulated with a molding compound such that at least the top side of the carrier and the side surfaces of the chip component and of the MEMS component are covered by the molding compound and the external connection areas are freely accessible, and wherein the component has an opening allowing media access to the MEMS component below the half-shell, wherein the opening is led from the bottom through the carrier, from the top through the half-shell, or from the top through the molding compound and the half-shell.

2. The component according to claim 1,
wherein the carrier is constructed from an electrically insulating material in a multilayered fashion, said carrier having the upwardly facing internal connection areas, the downwardly facing external connection areas and at least one wiring plane,
wherein the internal connection areas are connected to the wiring plane and/or the external connection areas via first plated-through holes.

3. The component according to claim 1,
wherein the half-shell constitutes a housing trough having at the housing base, internal and external contacts which are electrically connected to one another,
wherein the MEMS component is mounted in the housing trough and is electrically conductively connected to the internal contacts,
wherein the external contacts of the housing trough are connected to the internal connection areas of the carrier via bonding wires.

4. The component according to claim 1,
wherein the molding compound is applied such that the upwardly facing main surface of the half-shell continues not to be covered by the molding compound.

5. The component according to claim 1,
wherein the half-shell consists of ceramic, semiconductor material, metal, glass, plastic or a composite material comprising at least one layer of one of the aforementioned materials.

6. The component according to claim 1,
wherein the MEMS component is mounted directly onto the internal connection areas of the carrier.

7. The component according to claim 1,
wherein the MEMS component is embodied as a sensor or as a microphone.

8. The component according to claim 1,
wherein the chip component is a bare die, a packaged active or passive component or some other electrical component that is able to withstand a molding process.

9. A method for producing a component according to claim 1,
wherein a carrier having internal and external electrical connection areas is provided,
wherein a half-shell embodied as a housing trough of an SMD housing is provided, said half-shell having internal and external contacts at its base,
wherein a MEMS component is mounted in the housing trough and electrically connected to the internal contacts,
wherein the housing trough is adhesively bonded onto the carrier such that the MEMS component is enclosed in a cavity between the housing trough and the carrier,
wherein a chip component is furthermore mounted on the carrier,
wherein the external contacts and the internal connection areas are mutually electrically connected by bonding wires,
wherein the component is encapsulated with a molding compound by molding by means of a molding method, such that at least the surface of the carrier and the side walls of chip component and MEMS component are covered by the molding compound, but the external connection areas continue not to be covered by the molding compound.

10. The component according to claim 2,
wherein the half-shell constitutes a housing trough having at the housing base, internal and external contacts which are electrically connected to one another,
wherein the MEMS component is mounted in the housing trough and is electrically conductively connected to the internal contacts,
wherein the external contacts of the housing trough are connected to the internal connection areas of the carrier via bonding wires.

11. The component according to claim 2,
wherein the component has an opening allowing media access to the MEMS component below the half-shell, wherein the opening is led from the bottom through the carrier from the top through the half-shell or from the top through the molding compound and the half-shell.

12. The component according to claim 2,
wherein the molding compound is applied such that the upwardly facing main surface of the half-shell continues not to be covered by the molding compound.

13. The component according to claim 2,
wherein the half-shell is adhesively bonded on the carrier by means of a structured adhesive layer.

14. The component according to claim 2,
wherein the MEMS component is mounted directly onto the internal connection areas of the carrier.

15. The component according to claim 2,
wherein the chip component is a bare die, a packaged active or passive component or some other electrical component that is able to withstand a molding process.

16. The component according to claim 3,
wherein the carrier is embodied as a lead frame having an island formed in a planar fashion,
wherein the half-shell is adhesively bonded on the island such that a cavity closed toward the lead frame is formed between the half-shell and the island of the lead frame.

17. The method according to claim 9,
wherein the MEMS component is a sensor or a microphone, wherein, before or after molding, an opening extending through the carrier, the housing trough or the housing trough together with molding compound applied thereabove is produced, said opening enabling media access to the MEMS component in the cavity (CV) below the housing trough.

18. A component,
wherein a chip component and a MEMS component are arranged on a carrier having internal and external electrical connection areas and are electrically conductively connected to the internal connection areas,
wherein the MEMS component is arranged below a half-shell seated on the carrier,
wherein the entire component is encapsulated with a molding compound such that at least the top side of the carrier and the side surfaces of the chip component and of the MEMS component are covered by the molding compound and the external connection areas are freely accessible,
wherein the half-shell constitutes a housing trough having at the housing base, internal and external contacts which are electrically connected to one another, wherein a MEMS component is mounted in the housing trough and electrically connected to the internal contacts,
wherein the external contacts and the internal connection areas are connected to bonding wires, and
wherein the MEMS component is connected to the housing base via elastic metallic spring elements.

* * * * *